(12) United States Patent
Sato et al.

(10) Patent No.: US 12,731,759 B2
(45) Date of Patent: Sep. 8, 2026

(54) BEAM DETECTOR, MULTI-CHARGED-PARTICLE-BEAM IRRADIATION APPARATUS, AND ADJUSTMENT METHOD FOR BEAM DETECTOR

(71) Applicant: NuFlare Technology, Inc., Yokohama (JP)

(72) Inventors: Yasutaka Sato, Hachioji (JP); Hironori Mizoguchi, Yokohama (JP); Toru Hinata, Yokohama (JP); Toshiki Kimura, Yokohama (JP); Kiminobu Akeno, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 380 days.

(21) Appl. No.: 18/461,180

(22) Filed: Sep. 5, 2023

(65) Prior Publication Data

US 2024/0136148 A1 Apr. 25, 2024
US 2024/0234083 A9 Jul. 11, 2024

(30) Foreign Application Priority Data

Oct. 24, 2022 (JP) ................................ 2022-170017

(51) Int. Cl.
*H01J 37/244* (2006.01)
*H01J 37/09* (2006.01)
*H01J 37/317* (2006.01)

(52) U.S. Cl.
CPC ............ *H01J 37/244* (2013.01); *H01J 37/09* (2013.01); *H01J 37/3174* (2013.01);
(Continued)

(58) Field of Classification Search
CPC .... H01J 37/244; H01J 37/3177; H01J 37/153; H01J 37/09; H01J 37/3174;
(Continued)

(56) References Cited

U.S. PATENT DOCUMENTS 5,396,077 A 3/1995 Sohda et al.
5,838,450 A * 11/1998 McCoy .............. G03F 7/70358 250/548

(Continued)

FOREIGN PATENT DOCUMENTS

CN 113892165 A 1/2022
JP 6-275500 A 9/1994

(Continued)

OTHER PUBLICATIONS

Korean Office Action issued Feb. 13, 2025 in Korean Patent Application No. 10-2023-0136418, (with unedited computer-generated English translation), citing documents 15-16 therein, 13 pages.

(Continued)

*Primary Examiner* — Wyatt A Stoffa
*Assistant Examiner* — Larry Li
(74) *Attorney, Agent, or Firm* — Oblon, McClelland, Maier & Neustadt, L.L.P.

(57) ABSTRACT

In one embodiment, a beam detector includes a first aperture plate including a first passage hole, a second aperture plate including a second passage hole that allows a single detection target beam passing through the first passage hole to pass therethrough, and a sensor detecting a beam current of the detection target beam passing through the second passage hole. The second aperture plate includes an electrically conductive material, a plurality of third passage holes are formed around the second passage hole, and the plurality of third passage holes allow light to pass therethrough.

2 Claims, 6 Drawing Sheets

(52) U.S. Cl.
CPC .................. *H01J 2237/0451* (2013.01); *H01J 2237/1501* (2013.01); *H01J 2237/24564* (2013.01)

(58) Field of Classification Search
CPC ....... H01J 2237/0451; H01J 2237/1501; H01J 2237/24564; H01J 2237/24535; H01J 37/045; H01J 37/10; H01J 37/243; G01T 1/29; G01T 1/2921
See application file for complete search history.

(56) References Cited

U.S. PATENT DOCUMENTS 8,330,103 B2 12/2012 Enyama et al.
8,723,117 B2* 5/2014 Lanio .................... H01J 37/147 250/398
10,283,316 B2 5/2019 Yamashita et al.
10,714,311 B2 7/2020 Goshima et al.
11,513,087 B2 11/2022 Ren et al.
12,080,515 B2* 9/2024 Ren ......................... H01J 37/05
12,196,692 B2 1/2025 Ren et al.
2002/0074939 A1* 6/2002 Okubo .................... H01J 37/22 313/525
2003/0085365 A1* 5/2003 Yahiro .................... H01J 37/28 250/492.2
2004/0032575 A1 2/2004 Nishi et al.
2012/0232686 A1* 9/2012 Xin ......................... H10P 72/53 700/114
2015/0064934 A1* 3/2015 Yoshikawa ......... H01J 37/3177 438/798
2015/0200074 A1* 7/2015 Hamaguchi ......... H01J 37/3177 250/396 R
2018/0040455 A1* 2/2018 Yamashita .............. H01J 37/28
2022/0268277 A1* 8/2022 Ahn .................... F04C 18/0215
2022/0293390 A1* 9/2022 Tyminski ................ H01J 37/20
2022/0319797 A1* 10/2022 Gu .......................... H01J 37/20
2023/0298848 A1* 9/2023 Nakamura .............. H01J 37/09 250/515.1
2024/0079499 A1* 3/2024 Takahashi .......... H10D 30/6755

FOREIGN PATENT DOCUMENTS

JP 10-261566 A 9/1998
JP 2002-319534 A 10/2002
JP 2003-77814 A 3/2003
JP 2005-340229 A 12/2005
JP 2009-9882 A 1/2009
JP 2024-30513 A 3/2014
JP 2018-26544 A 2/2018
KR 10-2018-0016942 A 2/2018
KR 10-2022-0062640 A 5/2022
KR 10-2432752 B1 8/2022
KR 10-2714508 B1 10/2024
TW 202201454 A 1/2022
TW 202234450 A 9/2022
WO WO-2021/073868 A1 4/2021
WO WO 2021/180365 A1 9/2021
WO WO 2021/190976 A1 9/2021

OTHER PUBLICATIONS

Japanese Office Action issued Jan. 6, 2026 in Japanese Patent Application No. 2022-170017 (with unedited computer-generated English Translation), citing references 1-4 therein, 7 pages.
Korean Notice of Allowance issued Oct. 28, 2025 in Korean Patent Application No. 10-2023-0136418, citing documents 1-5 therein, 5 pages.
Combined Taiwanese Office Action and Search Report issued Aug. 7, 2024 in Taiwanese Patent Application No. 112133887 (with English Translation of Category of Cited Documents), citing references 1 and 15-18 therein, 5 pages.

* cited by examiner

52
IVB
50
51
IVB 52
51
52
50
Dmin
Dmax 41
50
θ
73

OUTERMOST POINT
41
Dmax
50
Dmin
73

BEAM DETECTOR, MULTI-CHARGED-PARTICLE-BEAM IRRADIATION APPARATUS, AND ADJUSTMENT METHOD FOR BEAM DETECTOR

CROSS REFERENCE TO RELATED APPLICATION

This application is based upon and claims benefit of priority from the Japanese Patent Application No. 2022-170017, filed on Oct. 24, 2022, the entire contents of which are incorporated herein by reference.

FIELD

The present invention relates to a beam detector, a multi-charged-particle-beam irradiation apparatus, and an adjustment method for beam detector.

BACKGROUND

With high integration of LSI, the circuit line width of semiconductor devices has been further miniaturized. An electron beam writing technique with a superior resolution is used as a method of forming an exposure mask (the one used in a stepper or a scanner is also called a reticle) for forming a circuit pattern on these semiconductor devices.

Writing apparatuses using multiple beams are being developed as electron beam writing apparatuses. The use of multiple beams enables irradiation with a large number of beams as compared with writing using a single electron beam, and thus allows a significant increase in throughput. In a multi-beam writing apparatus, for example, an electron beam emitted from an electron gun passes through an aperture member having multiple apertures, thus forming multiple beams. Each of the beams is subjected to blanking control through a blanking aperture array. The beams that have not been blocked are reduced through an optical system and are then applied to a substrate placed on a movable stage.

For precisely keeping irradiation positions of the multiple beams on the substrate, it is important to precisely determine the position of each of the beams constituting the multiple beams. In a configuration in which a small number of beams, for example, a few beams, are used and in which the pitch of beams, or beam pitch, is sufficiently large, marks equal in number to the beams are arranged on a stage, and each of the beams is caused to scan over the corresponding mark, so that the position of the beam can be determined.

Significantly increasing the throughput for finer circuit patterns requires a larger number of beams, serving as multiple beams. As the number of beams increases, the beams have a smaller diameter, and the beam pitch decreases. As the beam pitch decreases due to an increase in the number of beams as described above, it is more difficult to detect individual beams of the applied multiple beams with the marks arranged on the stage.

A recently developed individual beam detector includes a thin-film aperture member having a single passage hole having a size smaller than the beam pitch of multiple beams and larger than the diameter of each of the multiple beams, and detects a single detection target beam passing through the passage hole with a sensor, such as a photodiode. In such an individual beam detector, scattered electrons caused by beams located in proximity to the detection target beam and transmitted through the thin-film aperture member may be incident on the sensor, serve as a noise source, and reduce the accuracy of detection. To block the scattered electrons, a second aperture member can be disposed between the thin-film aperture member (first aperture member) and the sensor. However, it is difficult to align the hole of the thin-film aperture member with a hole of the second aperture member because both the holes of these aperture members are minute holes.

DETAILED DESCRIPTION

In one embodiment, a beam detector includes a first aperture plate including a first passage hole, a second aperture plate including a second passage hole that allows a single detection target beam passing through the first passage hole to pass therethrough, and a sensor detecting a beam current of the detection target beam passing through the second passage hole. The second aperture plate includes an electrically conductive material, a plurality of third passage holes are formed around the second passage hole, and the plurality of third passage holes allow light to pass therethrough.

Hereinafter, an embodiment of the present invention will be described with reference to the drawings.

Figure 1:
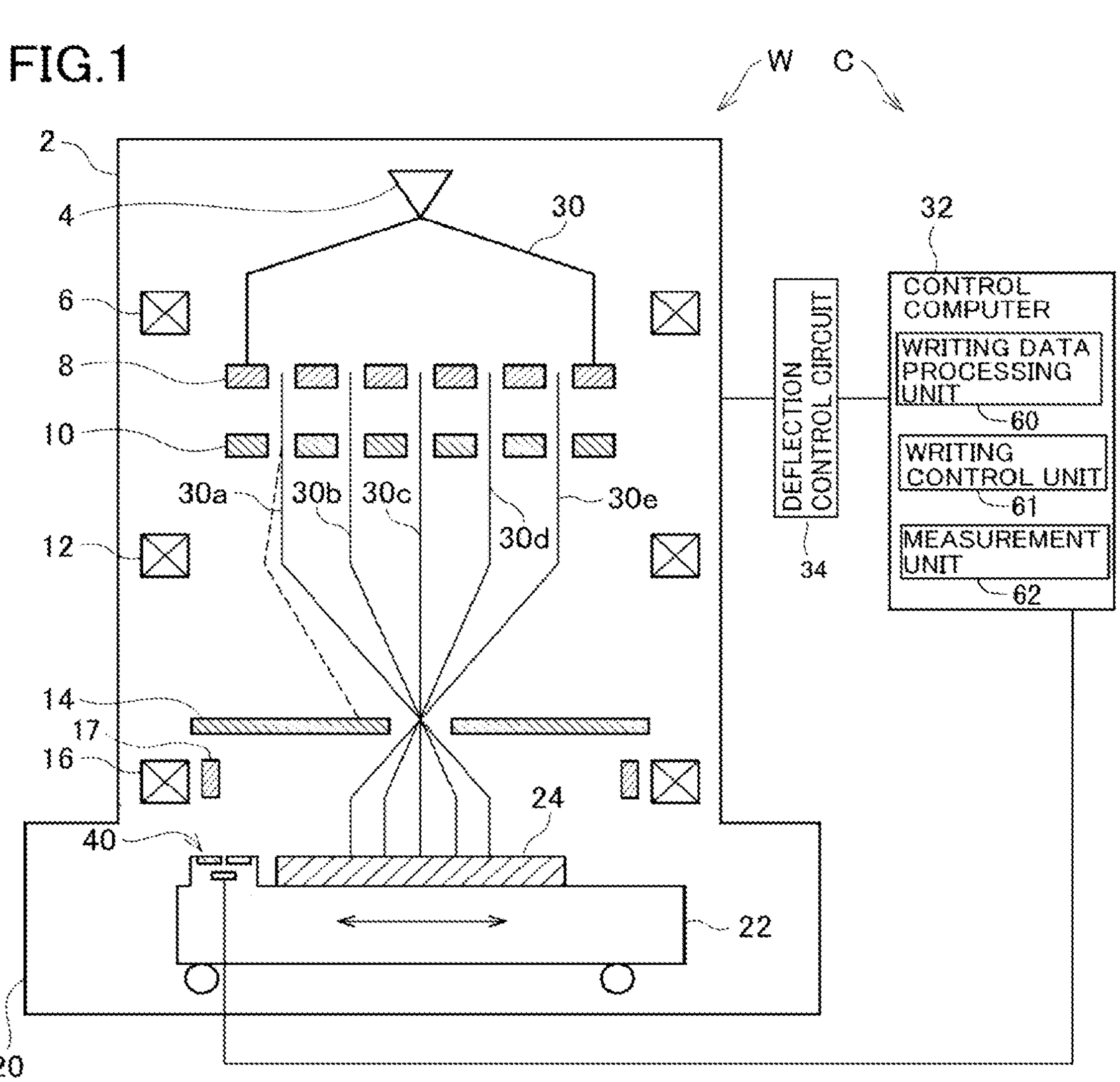
FIG. 1 is a schematic diagram of a multi-charged-particle-beam writing apparatus according to an embodiment of the present invention.

FIG. 1 is a schematic diagram of a multi-charged-particle-beam writing apparatus according to an embodiment of the present invention. In the present embodiment, a configuration using an electron beam as an example of a charged particle beam will be described. The charged particle beam is not limited to the electron beam. Another charged particle beam, such as an ion beam, may be used.

This writing apparatus includes a writing unit W, which applies electron beams to a writing target substrate 24 to write a desired pattern on the substrate, and a controller C, which controls an operation of the writing unit W.

The writing unit W includes an electron beam column 2 and a writing chamber 20. The electron beam column 2 contains an electron gun 4, an illumination lens 6, a shaping aperture array plate 8, a blanking aperture array plate 10, a reduction lens 12, a limiting aperture member 14, an objective lens 16, and a deflector 17.

The writing chamber 20 contains an XY stage 22. The writing target substrate 24 is placed on the XY stage 22. Examples of the writing target substrate 24 include a wafer and an exposure mask that is used to transfer a pattern to a wafer with a reduction projection exposure apparatus or an extreme ultraviolet (EUV) exposure apparatus, such as a stepper or a scanner, including an excimer laser as a light source.

A transmission mark type individual beam detector 40 is disposed on the XY stage 22 at a position different from a position at which the substrate 24 is placed. A level at which the individual beam detector 40 is disposed can be adjusted by an adjustment mechanism (not illustrated). The individual beam detector 40 is preferably installed such that its upper surface is at the same level as the surface of the substrate 24.

The controller C includes a control computer 32 and a deflection control circuit 34.

The control computer 32 includes a writing data processing unit 60, a writing control unit 61, and a measurement unit 62. These units of the control computer 32 may be implemented by hardware, such as electric circuitry, or software, such as a program that performs functions of the units. If the units are implemented by software, a program that achieves the functions of the units may be stored in a recording medium, and a computer including a central processing unit (CPU) may be caused to read and execute the program.

A storage device (not illustrated) stores writing data in a format for the writing apparatus converted from design data (layout data). The writing data processing unit 60 reads writing data from the storage device and executes multi-stage data conversion on the writing data to generate shot data. The shot data is generated for each pixel, and writing time (irradiation time) is computed. For example, when no pattern is formed in a target pixel, the target pixel is not irradiated with any beam. In this case, an identification code indicating “zero writing time” or “no beam irradiation” is defined. A maximum writing time T (maximum exposure time) for one multi-beam shot is set in advance. The irradiation time of each beam to be actually applied is preferably determined in proportion to a calculated area density of a pattern. The irradiation time of each beam that is finally calculated is preferably a period of time that corresponds to a dose obtained by correcting, with a dose, the amount of dimensional change resulting from a phenomenon (not illustrated), such as a proximity effect, a fogging effect, or a loading effect, which causes a dimensional change. For the irradiation time of each beam to be actually applied, irradiation time may vary from beam to beam. The writing time (irradiation time) of each beam is computed as a value within the maximum writing time T. The writing data processing unit 60 generates, for each multi-beam shot, irradiation time array data, in which pieces of data indicating computed irradiation periods of time of multiple beams for each pixel are arranged in the order of array of the multiple beams, as data for the beams to be used to write the pixel.

The writing control unit 61 uses the irradiation time array data (shot data) to output a control signal for a writing process to the deflection control circuit 34 and a control circuit (not illustrated) that drives the writing unit W. The writing unit W writes, based on the control signal, a desired pattern on the substrate 24 with multiple beams. Specifically, the writing unit W operates as follows.

Figure 2:
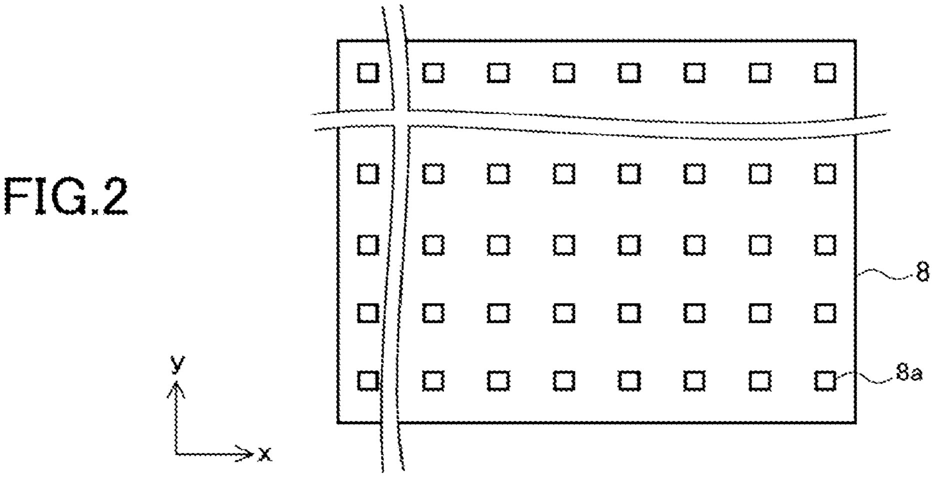
FIG. 2 is a schematic diagram of a shaping aperture array plate.

The electron gun 4 emits an electron beam 30. The illumination lens 6 causes the electron beam 30 to be applied substantially perpendicular to the entire shaping aperture array plate 8. FIG. 2 is a schematic diagram illustrating the configuration of the shaping aperture array plate 8. The shaping aperture array plate 8 has apertures 8*a* arrayed in a matrix of m columns extending in a longitudinal direction (y direction) of the plate×n rows extending in a lateral direction (x direction) thereof (m, n≥2) at a predetermined array pitch. For example, the apertures 8*a* are arrayed in a matrix of 512 columns×512 rows. The apertures 8*a* are rectangular and have the same dimensions and shape. The apertures 8*a* may be circular and have the same diameter.

The electron beam 30 is applied to an area including all of the apertures 8*a* of the shaping aperture array plate 8. The electron beam 30 partly passes through these apertures 8*a*, thus forming multiple beams 30*a* to 30*e* as illustrated in FIG. 1.

The blanking aperture array plate 10 has through-holes aligned with the respective apertures 8*a* of the shaping aperture array plate 8. In each of the through-holes, a blanker including two paired electrodes is disposed. Each of the electron beams 30*a* to 30*e* passing through the through-holes is independently deflected by a voltage applied by the blanker. This deflection achieves blanking control on the beams. The blanking aperture array plate 10 performs blanking deflection on each of the multiple beams that have passed through the apertures 8*a* of the shaping aperture array plate 8.

The multiple beams 30*a* to 30*e* that have passed through the blanking aperture array plate 10 are reduced in beam size and array pitch by the reduction lens 12 and travel toward a central aperture of the limiting aperture member 14. Electron beams deflected by the blankers of the blanking aperture array plate 10 are changed in trajectory, so that the electron beams are deviated from the central aperture of the limiting aperture member 14 and are accordingly blocked by the limiting aperture member 14. In contrast, electron beams that have not been deflected by the blankers of the blanking aperture array plate 10 pass through the central aperture of the limiting aperture member 14.

The limiting aperture member 14 blocks electron beams deflected in a beam OFF state by the blankers of the blanking aperture array plate 10. The beams passing through the limiting aperture member 14 for a period between the time when the beams enter a beam ON state and the time when the beams are switched to the beam OFF state correspond to electron beams of one shot.

The electron beams 30*a* to 30*e* that have passed through the limiting aperture member 14 are focused by the objective lens 16, thus forming a pattern image reduced at a desired reduction ratio on the substrate 24. The electron beams (multiple beams) that have passed through the limiting aperture member 14 are deflected together in the same direction by the deflector 17 and are applied to the substrate 24.

The multiple beams applied at a time are ideally arranged at a pitch obtained by multiplying the array pitch of the apertures 8*a* of the shaping aperture array plate 8 by the above-described desired reduction ratio. The writing apparatus performs a writing operation in a raster scanning manner such that beam shots are successively and sequentially applied. In writing a desired pattern, the blanking control is performed to cause beams necessary for the pattern to enter the beam ON state. While the XY stage 22 is continuously moving, the deflector 17 performs control such that the beam irradiation positions follow the movement of the XY stage 22.

Such a writing apparatus needs to determine individual irradiation positions of beams constituting the multiple beams to improve the accuracy of writing. For this purpose, the individual beam detector 40 is used to detect the position of each beam.

Figure 3:
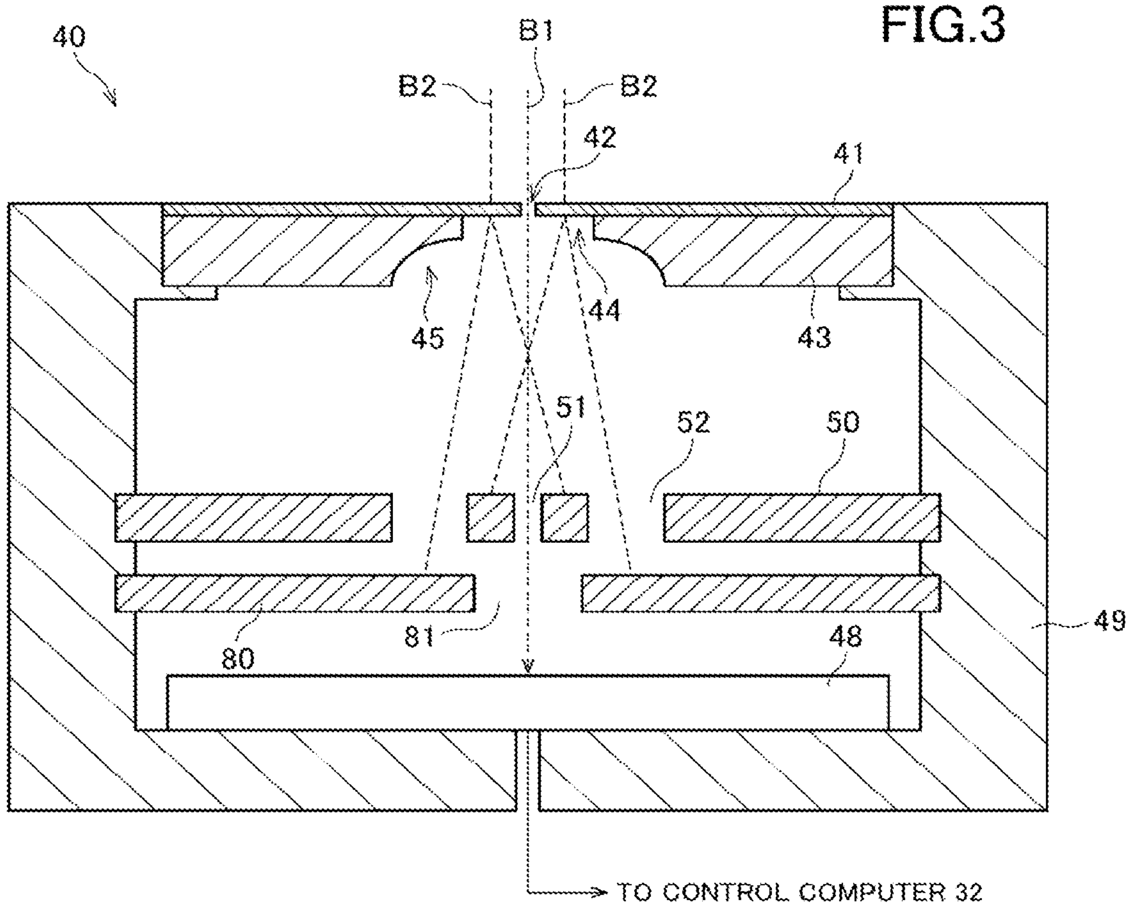
FIG. 3 is a schematic diagram illustrating the configuration of an individual beam detector.

FIG. 3 is a schematic diagram illustrating the configuration of the transmission mark type individual beam detector 40. The individual beam detector 40 includes a first aperture plate 41, a support 43, a second aperture plate 50, a scattered-electron cover 80, a sensor 48, and a casing 49.

The first aperture plate 41 (thin film) has, at its central part, a single minute hole 42 (first passage hole). The first aperture plate 41 is formed by a thin film having a thickness that allows the multiple beams to be transmitted through the film. Specifically, the first aperture plate 41 is made of heavy metal and is formed as a thin flat plate having a thickness of, for example, from 300 to 1000 nm. More preferably, the first aperture plate 41 may have a thickness of approximately 500 nm±50 nm. For example, electron beams emitted at an accelerating voltage of 50 keV cannot be absorbed by the first aperture plate 41, and are thus transmitted through the first aperture plate 41.

Such a thin-film structure of the first aperture plate 41 makes it difficult to transfer heat from a heated portion of the first aperture plate 41 to surroundings and thus can reduce heat dissipation. Preferable examples of heavy metal, serving as a material, include platinum (Pt), gold (Au), and tungsten (W). A thin-film structure made of heavy metal can reduce the amount of electrons that are transmitted through the structure when irradiated with the multiple beams.

The minute hole 42 has a diameter φ1, which is larger than a beam diameter of each individual beam of the multiple beams formed by electron beams and is smaller than a beam pitch. In the case where the beam pitch of the multiple beams ranges, for example, from approximately 150 to approximately 200 nm, the minute hole 42 is formed such that the diameter φ1 ranges, for example, from approximately 80 to approximately 120 nm. The diameter of the minute hole 42 is larger than the beam diameter of each individual beam and is smaller than the beam pitch. This prevents some of the multiple beams scanning over the minute hole 42 from simultaneously passing through the minute hole 42.

The first aperture plate 41 is supported by the support 43. The support 43 has an aperture 44, which is located under a portion of the first aperture plate 41 that includes the minute hole 42. In the example of FIG. 3, the aperture 44 is located at a central part of the support 43. The aperture 44 has a diameter (width) φ2, which is larger than the diameter φ1 of the minute hole 42. The aperture 44 has a size that allows a portion of the first aperture plate 41 that is located around the edge of the minute hole 42 to have a temperature higher than a vaporization temperature of impurities (contaminants) deposited on the edge when the first aperture plate 41 is irradiated with the multiple beams. For the vaporization temperature of contaminants, for example, a temperature of 100° C. or higher is preferably used.

As a material for the support 43, for example, molybdenum (Mo), platinum (Pt), tantalum (Ta), or silicon (Si) is preferably used. The support 43 is thick enough to block electron beams constituting the multiple beams and applied to the support without transmitting the beams therethrough. For example, a thickness of 15 μm or more enables blockage of electron beams accelerated at 50 key.

The support 43 further has an aperture 45, which is formed by thinning a lower portion of the support 43 that surrounds the edge of the aperture 44 to such an extent that no electrons are transmitted therethrough. This makes it difficult for heat transferred from the first aperture plate 41 to the support 43 around the edge of the aperture 44 to be transferred horizontally. Thus, a reduction in temperature of the portion of the first aperture plate 41 around the minute hole 42 above the aperture 44 can be further suppressed.

The support 43 has a perimeter greater than or equal to, for example, the perimeter of the first aperture plate 41. The support 43 has a bottom supported by the casing 49.

Figure 4A:
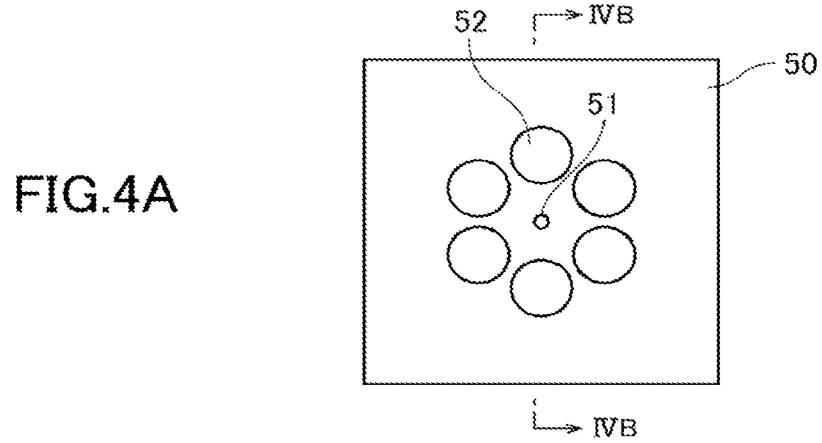
FIG. 4A is a plan view of a second aperture plate.
Figure 4B:
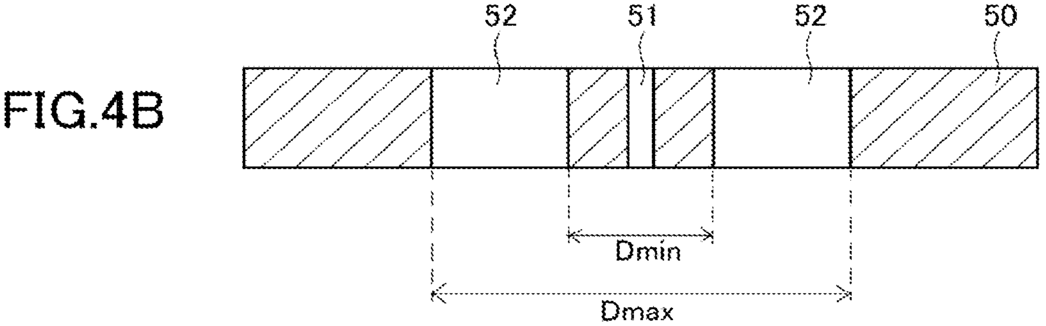
FIG. 4B is a sectional view taken along line IVB-IVB in FIG. 4A.

The second aperture plate 50 is disposed between the first aperture plate 41 and the sensor 48. As illustrated in FIGS. 4A and 4B, the second aperture plate 50 has a minute hole 51 (second passage hole) at its central part and multiple observation light passage holes 52 (third passage holes) around the minute hole 51. An outer portion of the second aperture plate 50 is fixed to the casing 49.

Observation light, which is used in a process of alignment of the minute hole 42 of the first aperture plate 41 and the minute hole 51 of the second aperture plate 50, may be visible radiation, infrared radiation, or ultraviolet radiation.

The multiple observation light passage holes 52 are circular and have the same dimensions and shape. The centers of the multiple observation light passage holes 52 are located at regular intervals on the same circumference centered on the minute hole 51. The observation light passage holes 52 have a diameter larger than that of the minute hole 51.

The observation light is blocked by a portion of the second aperture plate 50 that is other than the minute hole 51 and the observation light passage holes 52 without being transmitted through the portion. For the second aperture plate 50, a highly electrically resistive, non-magnetic, electrically conductive material is preferably used. Examples of such a material include a titanium alloy, a ceramic material (alumina or SiC) covered with an electrically conductive coating, and an electrically conductive ceramic (a mixture of SiC and Si). The second aperture plate 50 is thick enough to block scattered electrons.

The scattered-electron cover 80 is disposed between the second aperture plate 50 and the sensor 48. The scattered-electron cover 80 is fixed to the casing 49 and has an opening 81 at its central part. The opening 81 has a diameter larger than that of the minute hole 51.

The scattered-electron cover 80 can be made of the same material as that for the above-described second aperture plate 50. The distance between the second aperture plate 50 and the scattered-electron cover 80 and the diameter of the opening 81 of the scattered-electron cover 80 are set so that scattered electrons that have passed through the observation light passage holes 52 do not pass through the opening 81. Since the diameter of the opening 81 is larger than those of the minute hole 42 and the minute hole 51, the opening 81 can be easily aligned with the minute hole 42 and the minute hole 51. The minute hole 42, the minute hole 51, and the opening 81 are preferably located on the same axis.

Although the scattered-electron cover 80 may be disposed directly under and in tight contact with the second aperture plate 50 in the transmission mark type individual beam detector 40, friction caused by contact of the second aperture plate 50 with the scattered-electron cover 80 may displace the second aperture plate 50, thus causing the sensor to malfunction. In assembling the transmission mark type individual beam detector 40, therefore, the second aperture plate 50 is preferably disposed at a predetermined distance from the scattered-electron cover 80.

When the first aperture plate 41 is scanned with the multiple beams, a single detection target beam B1 of a group of beams applied to an area above the aperture 44 passes through the minute hole 42, the minute hole 51, and the opening 81, and is detected by the sensor 48.

The other beams are transmitted through the first aperture plate 41 and scatter from a lower surface of the first aperture plate 41. For example, beams B2 next to the detection target beam B1 may be transmitted through the first aperture plate 41 and scatter from the lower surface of the first aperture plate 41. Most of the scattered electrons are blocked by the second aperture plate 50. Some of the scattered electrons pass through the observation light passage holes 52 of the second aperture plate 50. The scattered electrons that have passed through the observation light passage holes 52 are blocked by the scattered-electron cover 80 and are thus prevented from reaching a light receiving surface of the sensor 48.

Of the multiple beams, a group of beams applied to an area other than the area above the aperture 44 are blocked by the support 43.

The sensor 48 is, for example, a solid-state detector (SSD), and detects a beam current of the detection target beam. Notification of a result of detection by the sensor 48 is provided to the control computer 32. As the first aperture plate 41 is scanned with the multiple beams, the measurement unit 62 acquires a beam current of each beam from the sensor 48. The measurement unit 62 converts the beam current into a brightness, forms a beam image based on the amount of deflection by the deflector 17, and acquires information on, for example, the shape of the whole of the multiple beams. For example, a dose of each beam is corrected based on the information.

Figure 5:
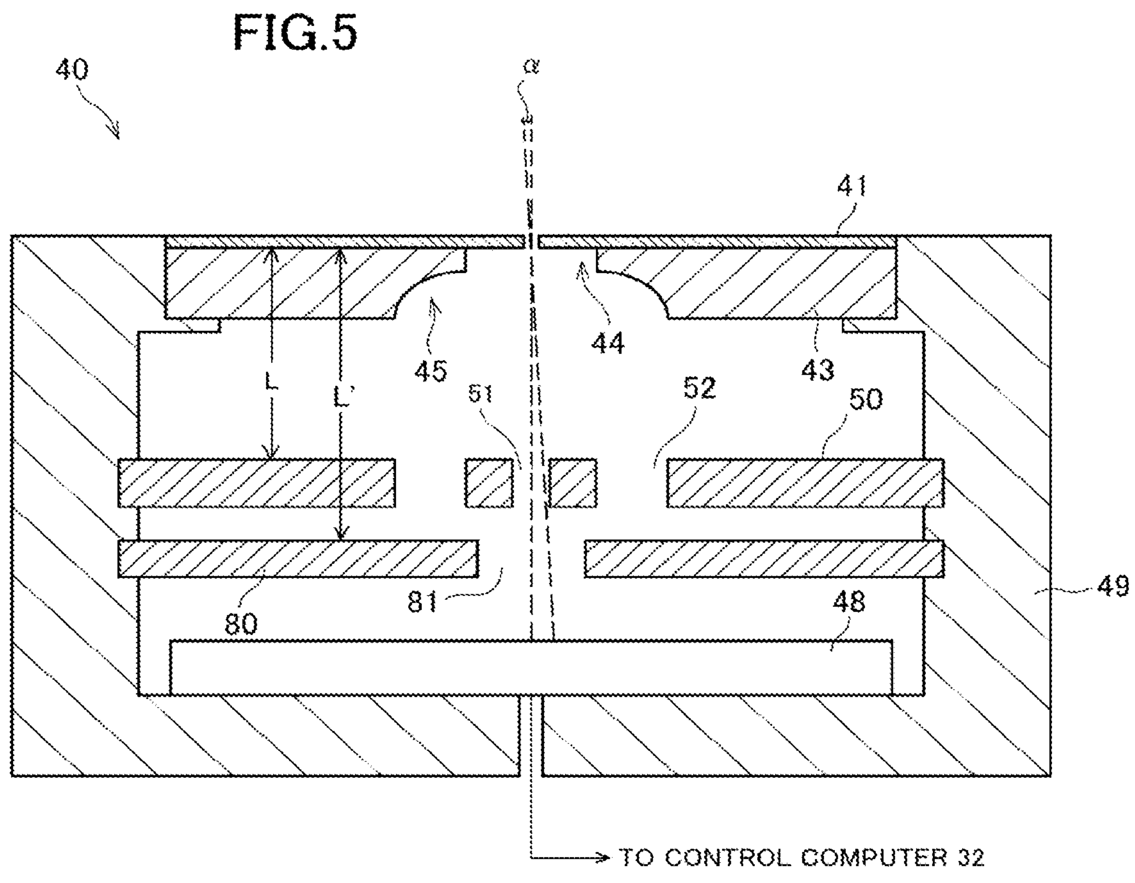
FIG. 5 is a schematic diagram illustrating the configuration of the individual beam detector.

As illustrated in FIG. 5, a [radian] denotes the landing angle of a detection target beam imaged, and L denotes the distance between the lower surface of the first aperture plate 41 and an upper surface of the second aperture plate 50. The diameter of the minute hole 51 is preferably greater than or equal to 2×a×L so that a beam passing through the minute hole 42 passes through the minute hole 51 and reaches the light receiving surface of the sensor 48. In addition, L' denotes the distance between the lower surface of the first aperture plate 41 and an upper surface of the scattered-electron cover 80. Similarly, the diameter of the opening 81 is preferably greater than or equal to 2×a×L' so that a beam passing through the minute hole 42 passes through the opening 81 and reaches the light receiving surface of the sensor 48.

The process of alignment (axial alignment) of the minute hole 42 of the first aperture plate 41 and the minute hole 51 of the second aperture plate 50 will now be described. The alignment process is performed outside the writing apparatus.

Figure 6:
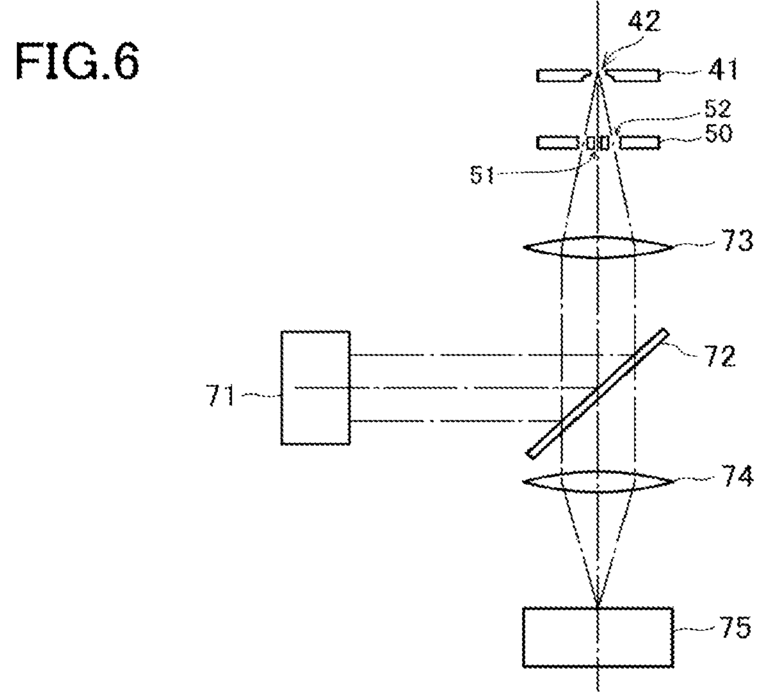
FIG. 6 is a diagram explaining a process of alignment of holes of two aperture plates.

As illustrated in FIG. 6, the alignment process uses an epi-illumination unit including a light source (light emitter) 71, which emits light, a semi-transparent mirror 72, an objective lens 73, an imaging lens 74, and an image sensor 75.

Observation light emitted from the light source 71 is reflected by the semi-transparent mirror 72 disposed at an angle of 45° to the optical axis, passes through the objective lens 73, and is then applied to observation targets (the first aperture plate 41 and the second aperture plate 50). The second aperture plate 50 is located between the objective lens 73 and the first aperture plate 41. The first aperture plate 41 has the support 43 attached thereto.

The light reflected by the observation targets passes through the objective lens 73 and then through the semi-transparent mirror 72, and is imaged on the image sensor 75 by the imaging lens 74. The image sensor 75 is, for example, a complementary metal-oxide-semiconductor (CMOS) image sensor.

First, the position of the objective lens 73 is adjusted, thereby focusing the objective lens 73 on the first aperture plate 41. Observation light passes through the minute hole 51 and the observation light passage holes 52 of the second aperture plate 50. An image detected by the image sensor 75 is observed to determine an image location of the minute hole 42. The determined location is set to a reference mark. For the observation light passage holes 52 of the second aperture plate 50, for example, the size of each hole, the positions of the holes, and the number of holes are set so that visible radiation required to determine the image location of the minute hole 42 can pass through the holes.

Figure 7:
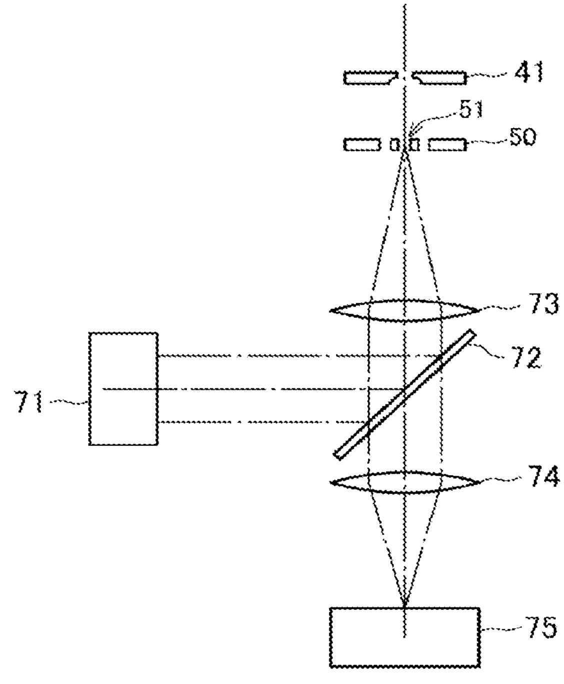
FIG. 7 is a diagram explaining the process of alignment of the holes of the two aperture plates.

Then, as illustrated in FIG. 7, the position of the objective lens 73 is adjusted, thereby focusing the objective lens 73 on the second aperture plate 50. The second aperture plate 50 is moved in a direction along a plane perpendicular to the optical axis by using a transfer mechanism (not illustrated) so that an image location of the minute hole 51 of the second aperture plate 50 coincides with the above-described reference mark.

When the image location of the minute hole 51 of the second aperture plate 50 coincides with the reference mark, the minute hole 42 of the first aperture plate 41 is precisely aligned with the minute hole 51 of the second aperture plate 50.

At the completion of alignment, the first aperture plate 41 and the support 43, the second aperture plate 50, the scattered-electron cover 80, and the sensor 48 are fixed to the casing 49, thus forming the individual beam detector 40 in which the minute hole 42 is aligned with the minute hole 51. The individual beam detector 40 is mounted in the writing apparatus.

As described above, according to the present embodiment, the minute holes 42 and 51 of the two aperture plates, or the first aperture plate 41 and the second aperture plate 50, can be aligned with each other with high precision.

The diameter of each observation light passage hole 52 of the second aperture plate 50 and the distance from the minute hole 51 to the observation light passage hole 52 are determined in consideration of the numerical aperture of the objective lens 73 of the epi-illumination unit used in the alignment process, the distance between the objective lens 73 and the first aperture plate 41, and the distance between the objective lens 73 and the second aperture plate 50.

Figures 10A, 10B:
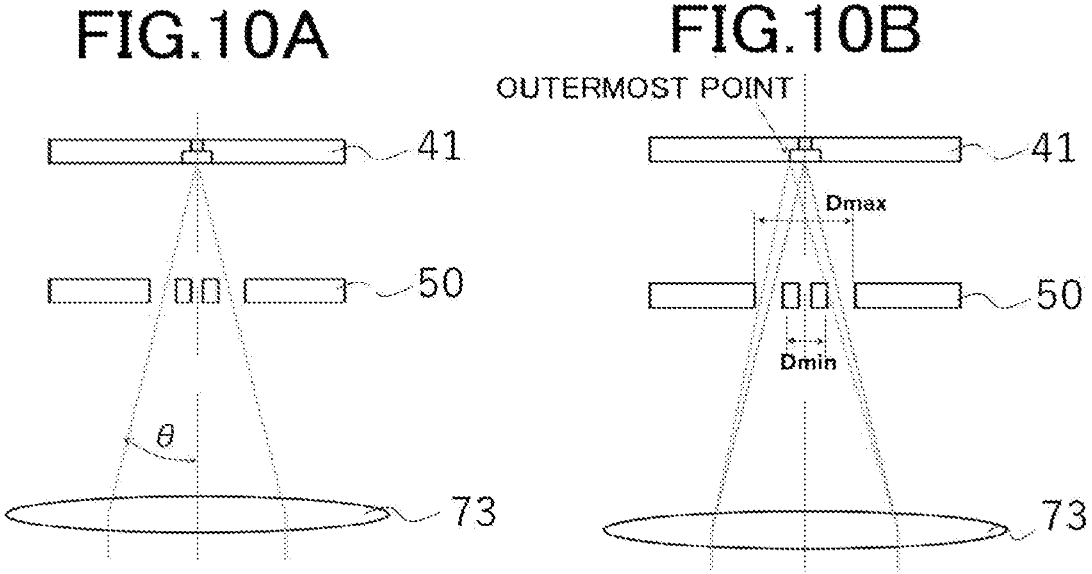
FIGS. 10A and 10B are diagrams each illustrating an optical path of alignment light.

As illustrated in FIGS. 4A and 4B, Dmax denotes an outside diameter (maximum diameter) of an arrangement region where the multiple observation light passage holes 52 are arranged on the same circumference, and Dmin denotes an inside diameter (minimum diameter) of the arrangement region. An optical path of alignment light is obtained from the numerical aperture of the objective lens 73, thereby determining the maximum diameter Dmax. The optical path of the alignment light is as illustrated in FIG. 10A. In FIG. 10A, an angle θ is calculated from the following equation by using the numerical aperture, NA, of the objective lens 73 and a refractive index n in an observation environment.

θ=sin^−1(*NA/n*)

As illustrated in FIG. 10B, the maximum diameter Dmax is set so that the observation light passage holes 52 are located on an optical path line connecting the objective lens 73 and an outermost point of the first aperture plate 41 that is to be observed. The outermost point to be observed refers to an observation range in which the shape of the hole of the first aperture plate 41 can be determined during alignment, more specifically, the edge of the aperture 44.

The minimum diameter Dmin is calculated by simulation to satisfy a required ratio of blockage of scattered electrons. The blockage ratio is expressed by (1−e)/1, where 1 denotes a situation in which an electron beam having a beam energy of 50 key, a beam diameter of 10 nm, and an intensity distribution regarded as Gaussian distribution is applied to the first aperture plate 41, and e denotes a transmittance at which scattered electrons transmitted through the openings including the minute hole 51 and the observation light passage holes 52 reach the sensor 48. Simulation results yield, for example, a blockage ratio greater than or equal to $(1-0.053)/1 \approx 94.7\%$.

As described above, the diameter of the opening 81 of the scattered-electron cover 80 is preferably greater than or equal to 2×a×L'. Furthermore, the diameter of the opening 81 is preferably smaller than the above-described minimum diameter Dmin so that a reduction in scattered-electron blockage ratio can be avoided.

The shape of the observation light passage holes arranged around the minute hole 51 in the second aperture plate 50 is not limited to that illustrated in FIG. 4A.

Figure 8:
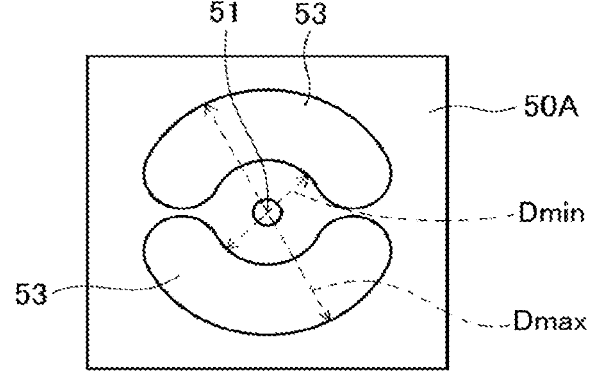
FIG. 8 is a plan view of a second aperture plate in a modification.

For example, as illustrated in FIG. 8, a second aperture plate 50A may have two substantially arc-shaped observation light passage holes 53 arranged on the same circumference.

Figure 9:
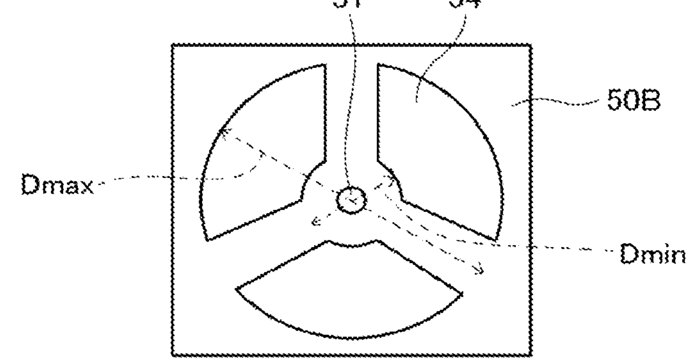
FIG. 9 is a plan view of a second aperture plate in another modification.

As illustrated in FIG. 9, a second aperture plate 50B may have multiple truncated sector-shaped observation light passage holes 54 spaced apart from each other on the same circumference. The term "truncated sector-shaped" refers to a shape obtained by removing the tip (at the center of a circle) of a sector from the sector. As the sector is away from the minute hole 51, its dimension in a circumferential direction increases. FIG. 9 illustrates exemplary arrangement of three observation light passage holes 54. Four or more observation light passage holes may be arranged.

For the examples of FIGS. 8 and 9, the maximum diameter (maximum width) Dmax and the minimum diameter (minimum width) Drain of the arrangement region for the observation light passage holes are as illustrated in FIGS. 8 and 9.

In the above-described embodiment, the configuration in which the scattered-electron cover 80 is disposed between the second aperture plate 50 and the sensor 48 has been described. If the second aperture plate 50 is disposed at a large distance from the sensor 48 so that scattered electrons passing through the observation light passage holes 52 fail to reach the sensor 48, the scattered-electron cover 80 may be omitted.

Furthermore, the casing 49 may have tilted side walls so that scattered electrons reflected by the side walls fail to reach the sensor 48.

In the above-described embodiment, the multi-beam writing apparatus has been described as an exemplary apparatus with the individual beam detector mounted therein. The embodiment is not limited to this example. The individual beam detector can similarly be mounted in any apparatus that emits multiple beams, for example, an inspection apparatus that inspects patterns for defects. The individual beam detector can be mounted in an apparatus that emits a single beam.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A beam-detector adjustment method comprising: applying observation light emitted from a light source to a first aperture plate through a second passage hole of a second aperture plate and a plurality of third passage holes around the second passage hole, the first aperture plate having a first passage hole being smaller than a beam pitch of multiple charged particle beams, the second passage hole allowing a single detection target beam of the multiple charged particle beams to pass therethrough, focusing an objective lens on the first aperture plate, observing an image formed by reflected light incident on an image sensor through the objective lens with the image sensor, and setting an image location of the first passage hole to a reference mark; and focusing the objective lens on the second aperture plate, observing an image formed by reflected light incident on the image sensor through the objective lens with the image sensor, and moving the second aperture plate to cause an image location of the second passage hole to coincide with the reference mark.

2. The beam-detector adjustment method according to claim 1, wherein the observation light emitted from the light source is blocked by a portion of the second aperture plate that is other than the second passage hole and the plurality of third passage holes without being transmitted through the portion.

* * * * *